United States Patent
Mori et al.

(10) Patent No.: US 7,372,037 B2
(45) Date of Patent: May 13, 2008

(54) SOLID-STATE IMAGING DEVICE AND RADIOTION IMAGING SYSTEM

(75) Inventors: Harumichi Mori, Hamamatsu (JP); Kazuki Fujita, Hamamatsu (JP); Ryuji Kyushima, Hamamatsu (JP); Masahiko Honda, Hamamatsu (JP)

(73) Assignee: Hamamatsu Photonics K.K., Shizuoka (JP)

( * ) Notice: Subject to any disclaimer, the term of this patent is extended or adjusted under 35 U.S.C. 154(b) by 0 days.

(21) Appl. No.: 10/536,904

(22) PCT Filed: Nov. 26, 2003

(86) PCT No.: PCT/JP03/15109

§ 371 (c)(1),
(2), (4) Date: Nov. 18, 2005

(87) PCT Pub. No.: WO2004/049448

PCT Pub. Date: Jun. 10, 2004

(65) Prior Publication Data

US 2006/0145084 A1    Jul. 6, 2006

(30) Foreign Application Priority Data

Nov. 28, 2002 (JP) .............................. 2002-346262

(51) Int. Cl.
*G01T 1/24* (2006.01)
(52) U.S. Cl. ................................. 250/370.11
(58) Field of Classification Search ............ 250/370.11
See application file for complete search history.

(56) References Cited

U.S. PATENT DOCUMENTS

| 5,537,146 | A  | * | 7/1996 | Tohyama ..................... 348/311 |
| 6,278,118 | B1 |   | 8/2001 | Homme et al. |
| 6,351,002 | B1 | * | 2/2002 | Pan ............................ 257/233 |
| 6,384,396 | B1 | * | 5/2002 | Mizuno et al. .......... 250/208.1 |
| 2002/0017611 | A1 | * | 2/2002 | Tashiro et al. .......... 250/370.11 |
| 2002/0063199 | A1 | * | 5/2002 | Kozuka .................... 250/214.1 |
| 2006/0027760 | A1 | * | 2/2006 | Rougeot et al. ....... 250/370.14 |

FOREIGN PATENT DOCUMENTS

| EP | 1 049 171 A1 | 11/2000 |
| EP | 1 130 638    | 9/2001 |
| EP | 1 173 007 A2 | 1/2002 |
| JP | 61-141177    | 6/1986 |
| JP | 62-086756    | 3/1987 |

(Continued)

*Primary Examiner*—David P. Porta
*Assistant Examiner*—David S Baker
(74) *Attorney, Agent, or Firm*—Drinker Biddle & Reath LLP (57) ABSTRACT

$N^+$-type semiconductor regions 12d are formed on a front surface side of a $p^-$-type layer 12c of a semiconductor substrate 12, and these $n^+$-type semiconductor and $p^-$-type semiconductor constitute photodiodes. A metal wire 14 electrically connected to an isolation region 12e is formed on a first insulating layer 13. The metal wire 14 is provided so that its edge covers pn junction portions (interfaces between $p^-$-type layer 12c and $n^+$-type semiconductor regions 12d) exposed on a light-incident surface of the semiconductor substrate 12 ($p^-$-type layer 12c), above the pn junction portions, and is of grid shape. The metal wire 14 is grounded and the isolation region 12e is set at the ground potential.

12 Claims, 9 Drawing Sheets

FOREIGN PATENT DOCUMENTS

| | | | |
|---|---|---|---|
| JP | 62086756 A * | 4/1987 | |
| JP | 9-73144 | 3/1997 | |
| JP | 11-122533 | 3/1999 | |
| JP | 2000-028735 | 1/2000 | |
| JP | 2002-252341 | 9/2002 | |
| WO | WO 98/36290 | 8/1998 | |
| WO | 01-75977 | 10/2001 | |

* cited by examiner

SOLID-STATE IMAGING DEVICE AND RADIOTION IMAGING SYSTEM

TECHNICAL FIELD

The present invention relates to a solid-state imaging apparatus and a radiographic imaging apparatus.

BACKGROUND ART

An example of the known radiographic imaging apparatus of this type is one having a fiber optical plate (hereinafter referred to as FOP), a scintillator disposed on one surface of the FOP, and an MOS image sensor disposed opposite to the scintillator on the other surface of the FOP (e.g., reference is made to Patent Document 1).

Another example of the known radiographic imaging apparatus is one having a photodetector array in which photodetectors for photoelectric conversion are arrayed in a one-dimensional or two-dimensional pattern, and a scintillator formed directly on light-incident surfaces of the photodetectors (e.g., reference is made to Patent Document 2).

[Patent Document 1] Japanese Patent Application Laid-Open No. 2000-28735

[Patent Document 2] PCT International Publication WO98/36290

DISCLOSURE OF THE INVENTION

In the case of the imaging apparatus as disclosed in Patent Document 1 above, it was impossible to further increase the area of the FOP itself and it was thus difficult to increase the image detecting area to a larger area. For this reason, one of conceivable countermeasures is the technique of forming the scintillator directly on the light-incident surfaces of the photodetectors, without use of the FOP, as disclosed in Patent Document 2 above. Another conceivable means is a technique of forming the scintillator on a support and bringing the scintillator into close contact with the light-incident surfaces of the photodetectors, instead of forming the scintillator directly on the light-incident surfaces of the photodetectors.

However, the configuration without the FOP was found to pose a new problem of deterioration of SN ratio. Research and study by Inventors has turned up the following new fact. Where the FOP is present, lead in the FOP shields against radiation not converted to light by the scintillator. Without the FOP, however, the radiation not converted to light by the scintillator is directly incident to the MOS image sensor to generate charge in the region except for the photodiodes, e.g., in a surface oxide film (such as a silicon oxide film) being a surface protecting film of the MOS image sensor. The generated charge is accumulated (or charged up) in a pn junction portion, whereby an interface leak of charge occurs in the pn junction portion being the edge of a photodiode, to generate a leak current. This leak current is superimposed on an electric current output from the photodiode to degrade the SN ratio.

An object of the present invention is to provide a solid-state imaging apparatus and a radiographic imaging apparatus capable of suppressing the occurrence of the interface leak of charge in the pn junction portion and thereby preventing the deterioration of the SN ratio.

A solid-state imaging apparatus according to the present invention comprises: a photosensitive section comprising a semiconductor substrate of a first conductivity type, and a plurality of second conductivity type semiconductor regions arrayed in a two-dimensional pattern on one side of the semiconductor substrate, wherein the semiconductor substrate and each second conductivity type semiconductor region constitute a pn junction to function as a photodiode; and an electroconductive member provided so as to cover at least the pn junction portions exposed on the one side of the semiconductor substrate, wherein the electroconductive member is connected to a fixed potential, or is grounded.

In the solid-state imaging apparatus according to the present invention, the electroconductive member provided so as to cover at least the pn junction portions exposed on one side of the semiconductor substrate is connected to the fixed potential, or is grounded, and thus the charge generated in the region except for the photodiodes is discharged through the electroconductive member to the outside, without being accumulated in the pn junction portions. For this reason, it is feasible to suppress the occurrence of the interface leak of charge in the pn junction portions and thereby prevent the deterioration of the SN ratio.

Preferably, the electroconductive member is of grid shape when viewed from a direction of incidence of light to the photosensitive section, and is provided so as to cover the pn junction portions exposed on the one side of the semiconductor substrate and portions between the second conductivity type semiconductor regions adjacent to each other. This configuration permits the electroconductive member to be simply and easily implemented in the configuration capable of discharging the charge generated in the region except for the photodiodes, to the outside and thereby surely suppressing the occurrence of the interface leak of charge in the pn junction portions.

Preferably, the photosensitive section further comprises an isolation region formed between the second conductivity type semiconductor regions adjacent to each other, and the electroconductive member is electrically connected to the isolation region. This configuration can achieve commonality between the electroconductive member for discharging the charge generated in the region except for the photodiodes, to the outside, and the electroconductive member for connecting the isolation region to the fixed potential or grounding it, thereby preventing complexity of structure.

Preferably, the solid-state imaging apparatus is configured in a configuration further comprising: signal lines for readout of outputs from the photodiodes, which are electrically connected to the photodiodes; a switch group consisting of a plurality of switches for controlling electrical connection and disconnection between each photodiode and the signal line in each column of the photodiodes; and wires connected to control terminals of the respective switches forming the switch group, and arranged to supply a scan signal to turn each switch off or on in each row of the photodiodes, to the control terminals, wherein the wires are located above the electroconductive member. In this configuration, the electroconductive member shields against noise generated with change of supply voltage in the wires on the occasion of supplying the scan signal to the control terminals. This can prevent the noise from being superimposed on outputs from the photodiodes.

Another solid-state imaging apparatus according to the present invention comprises: a photosensitive section comprising a semiconductor substrate of a first conductivity type, and a plurality of second conductivity type semiconductor regions arrayed in a matrix of M rows and N columns on one side of the semiconductor substrate, wherein the semiconductor substrate and each second conductivity type semiconductor region constitute a pn junction to function as a photodiode; first wires provided in the respective columns;

a fist switch group consisting of a plurality of switches for connection between each photodiode and the first wire in each column; a vertical shift register for outputting a vertical scan signal to open and close each switch forming the first switch group, in each row; second wires for connecting control terminals of the respective switches forming the first switch group, to the vertical shift register in each row, a second switch group consisting of a plurality of switches for connection between each first wire and a signal output line; a horizontal shift register for outputting a horizontal scan signal to open and close each switch forming the second switch group, m each column; and an electroconductive member provided so as to cover at least the pn junction portions exposed on the one side of the semiconductor substrate, wherein the electroconductive member is connected to a fixed potential, or is grounded.

Preferably, the second wires are located above the electroconductive member. In this configuration, the electroconductive member shields against noise generated with change of supply voltage in the second wires on the occasion of supplying the scan signal to the control terminals. This can prevent the noise from being superimposed on outputs from the photodiodes.

Still another solid-state imaging apparatus according to the present invention comprises: a photosensitive section comprising a semiconductor substrate of a first conductivity type, and a plurality of second conductivity type semiconductor regions arrayed in a two-dimensional pattern on one side of the semiconductor substrate, wherein the semiconductor substrate and each second conductivity type semiconductor region constitute a pn junction to function as a photodiode; and an electroconductive member for discharging a charge generated in a region except for the photodiodes, to the outside.

In the solid-state imaging apparatus according to the present invention, the charge generated in the region except for the photodiodes is discharged through the electroconductive member to the outside, without being accumulated in the pn junction portions. For this reason, it is feasible to suppress the occurrence of the interface leak of charge in the pn junction portions and thereby prevent the deterioration of the SN ratio.

Preferably, the electroconductive member is provided above the pn junction portions so as to cover at least the pn junction portions exposed on the one side of the semiconductor substrate, and is connected to a fixed potential or is grounded. This configuration permits the electroconductive member to be simply and easily implemented in the configuration capable of discharging the charge generated in the region except for the photodiodes, to the outside.

A radiographic imaging apparatus according to the present invention comprises the foregoing solid-state imaging apparatus, and a scintillator for converting radiation to visible light, which is provided so as to cover the plurality of photodiodes.

In the radiographic imaging apparatus according to the present invention, as described above, the charge generated in the region except for the photodiodes is discharged through the electroconductive member to the outside, without being accumulated in the pn junction portions, whereby it is feasible to suppress the occurrence of the interface leak of charge in the pn junction portions and thereby prevent the deterioration of the SN ratio.

BEST MODE FOR CARRYING OUT THE INVENTION

A preferred embodiment of the present invention will be described below in detail with reference to the drawings. Identical elements or elements with identical functionality will be denoted by the same reference symbols in the description, without redundant description. A radiographic imaging apparatus according to the present embodiment incorporates a solid-state imaging apparatus (solid-state image sensor) according to an embodiment of the present invention.

Figure 1:
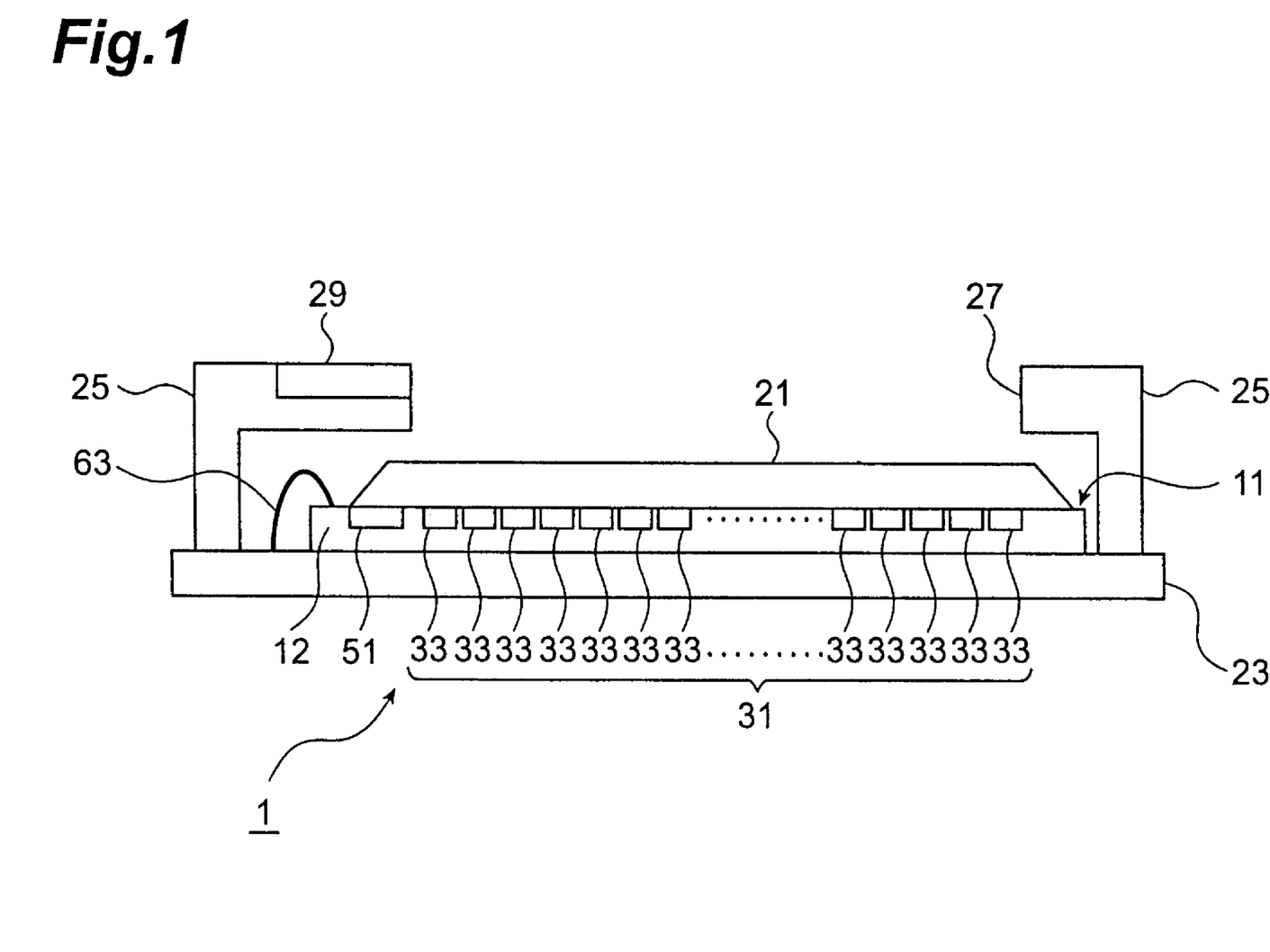
FIG. 1 is a schematic view for explaining a cross-sectional configuration of a radiographic imaging apparatus according to an embodiment of the present invention.
Figure 2:
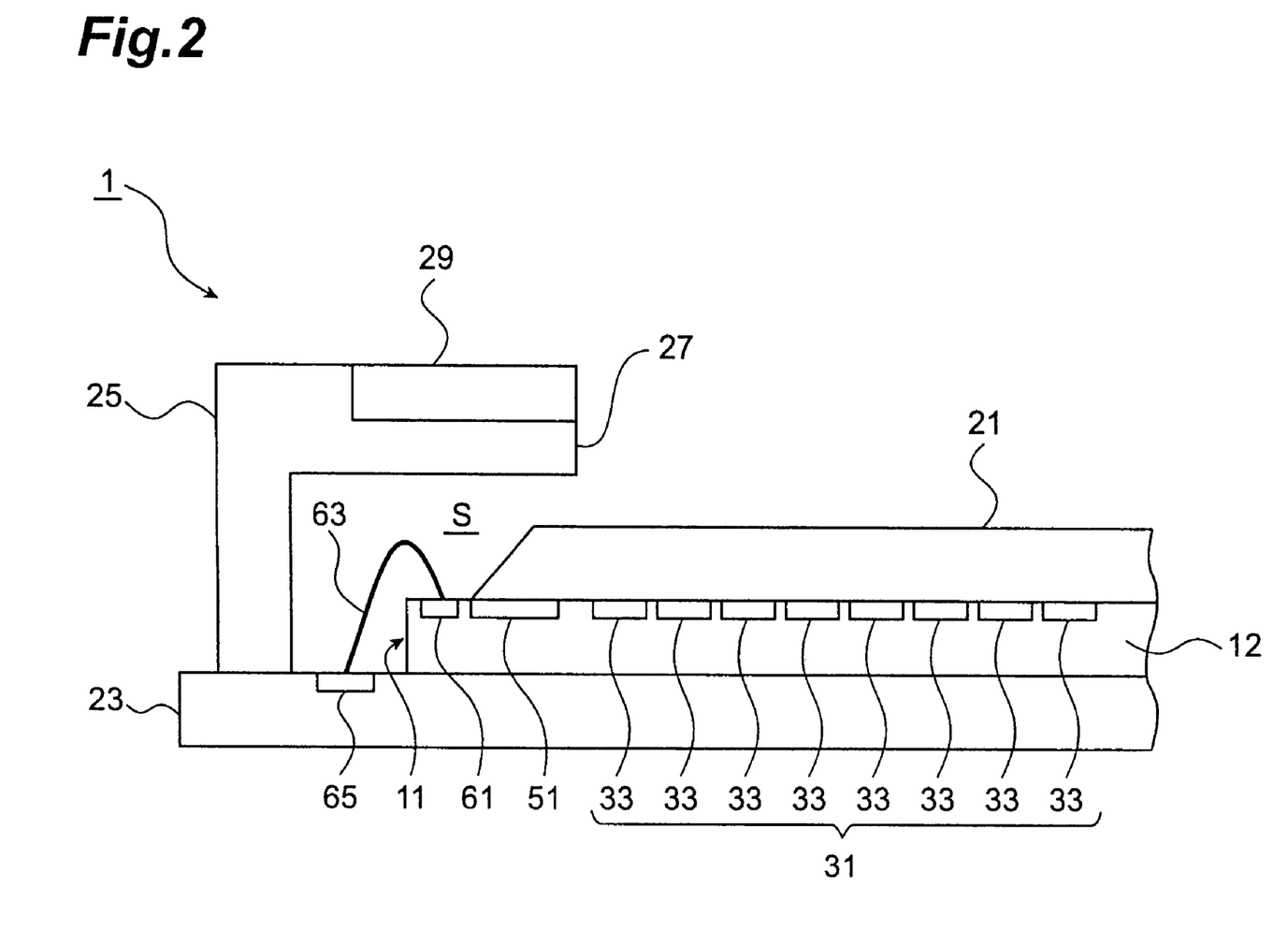
FIG. 2 is a schematic view for explaining the cross-sectional configuration of the radiographic imaging apparatus according to the embodiment of the present invention.
Figure 3:
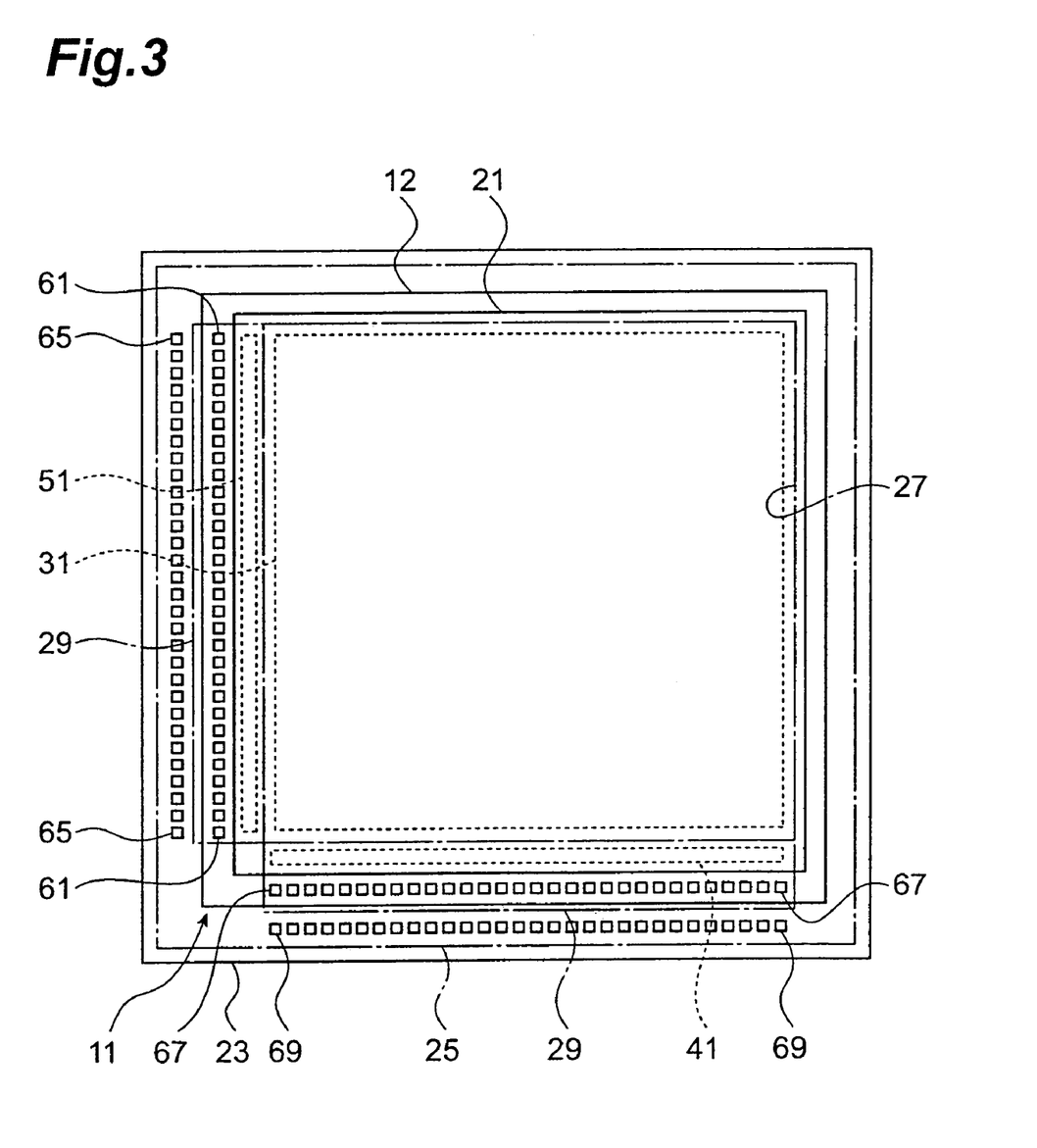
FIG. 3 is a plan view showing the radiographic imaging apparatus according to the embodiment of the present invention.
Figure 4:
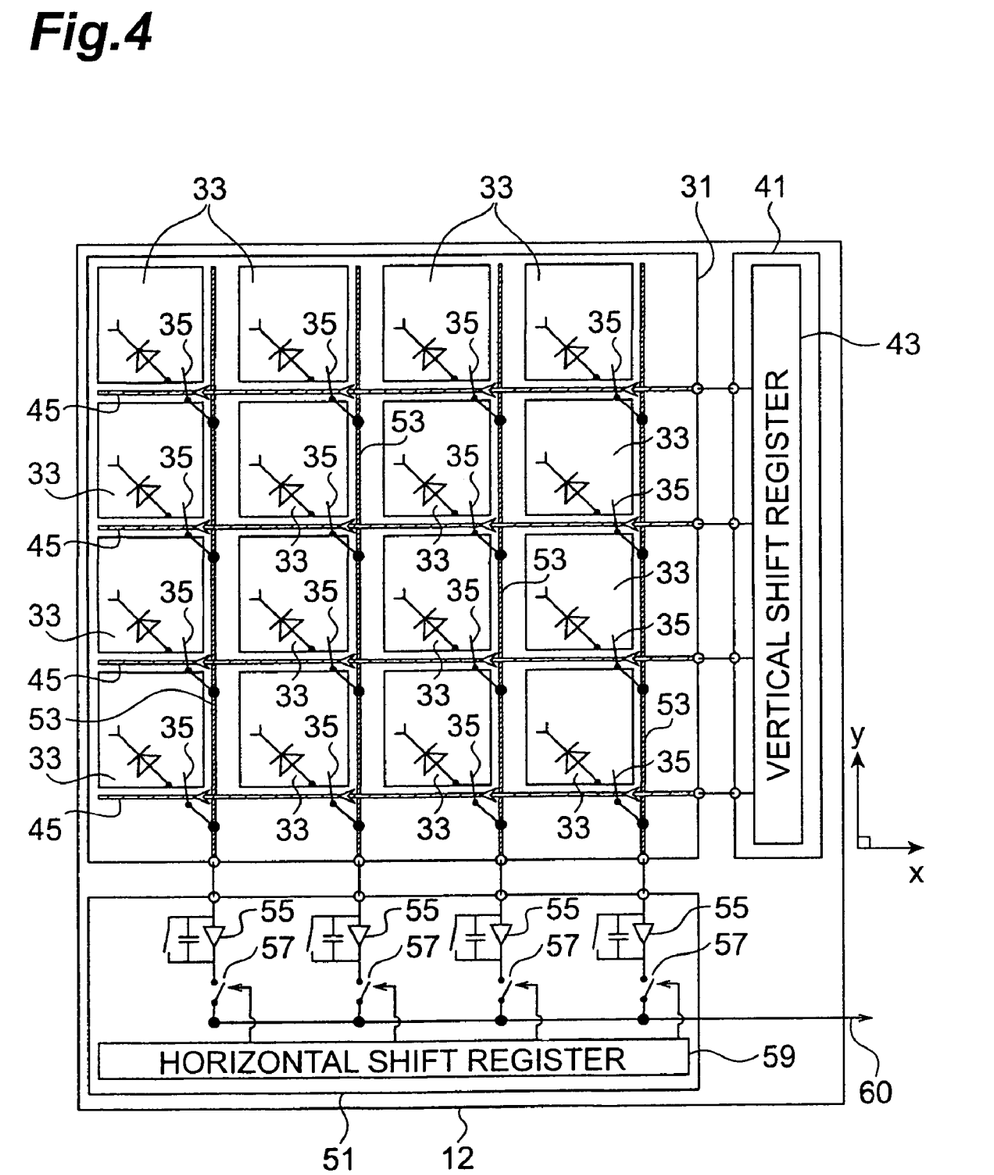
FIG. 4 is a configuration diagram showing the radiographic imaging apparatus according to the embodiment of the present invention.

FIGS. 1 and 2 are schematic views for explaining a cross-sectional configuration of the radiographic imaging apparatus according to the present embodiment, and FIG. 3 is a plan view showing the radiographic imaging apparatus according to the present embodiment. FIG. 4 is a configuration diagram showing the radiographic imaging apparatus according to the present embodiment. FIG. 3 is depicted without illustration of bonding wires.

The radiographic imaging apparatus 1 of the present embodiment, as shown in FIGS. 1 to 3, has a solid-state image sensor 11, a scintillator 21, a mount substrate 23, a frame 25, and others.

The solid-state image sensor 11 is an MOS image sensor, and has a photosensitive section 31, a shift register section 41, and an amplification section 51, which are formed on one side of a semiconductor substrate 12. In this manner, the photosensitive section 31, the shift register section 41, and the amplification section 51 are formed on the same substrate (semiconductor substrate 12). The semiconductor substrate 12 (solid-state image sensor 11) is fixed on the mount substrate 23. In the present embodiment, the area of the semiconductor substrate 12 is approximately 16900 mm$^2$ (=130 mm×130 mm), and the area of the photosensitive section 31 approximately 15625 mm$^2$(=125 mm×125 mm).

The photosensitive section 31, as shown in FIG. 4, is constructed in a configuration wherein a plurality of photodiodes (photoelectric converters) 33 for storing charges according to intensities of incident light are arrayed in a two-dimensional pattern on the semiconductor substrate 12. More specifically, the photosensitive section 31 is composed of M×N photodiodes 33 arrayed in a matrix of M rows in the y-axis direction and N columns in the x-axis direction (M and N are natural numbers). In FIG. 4, M and N are determined to be "4."

Each of the photodiodes 33 forming the photosensitive section 31 is provided with a gate switch (switch forming a first switch group) 35 one end of which is electrically connected to the photodiode 33 and the other end of which is electrically connected to a signal readout line described later. Therefore, during an opening period of the gate switch 35, a charge is stored in the photodiode 33 with incidence of light, and the charge stored in the photodiode 33 is read out to the later-described signal readout line with closure of the gate switch 35. The gate switch 35 can be constructed of an MOSFET (field effect transistor).

The shift register section 41 includes a vertical shift register 43 and is formed so as to face one side of the photosensitive section 31, on the semiconductor substrate 12. The vertical shift register 43 outputs a vertical scan signal to open and close each gate switch 35. The vertical scan signal includes two types of drive voltages at a high (H) level and at a low (L) level, and the difference between these drive voltages is approximately several V.

A control terminal of each gate switch 35 is electrically connected to the vertical shift register 43 by a gate line (second wire; wire) 45. In this configuration, each gate switch 35 can be opened and closed by a vertical scan signal outputted from the vertical shift register 43. Specifically, the gate lines 45 extend in the x-axis direction through portions between rows of photodiodes 33 arrayed in the photosensitive section 31, and each gate line 45 is connected to the control terminals of the respective gate switches 35 existing in one row. Accordingly, the vertical shift register 43 and the control terminals of the gate switches 35 are connected on a row-by-row basis.

Furthermore, N signal readout lines (first wires; signal lines) 53 to which the other ends of the gate switches 35 are electrically connected in each column are provided between columns of photodiodes 33 arrayed in the photosensitive section 31. The N signal readout lines 53 are electrically connected to the amplification section 51. The amplification section 51 includes charge amplifiers 55, readout switches (switches constituting a second switch group) 57, a horizontal shift register 59, and so on. The amplification section 51 is formed so as to face one side adjacent to the one side of the photosensitive section 31 which the shift register section 41 is formed so as to face, on the semiconductor substrate 12.

The charge amplifiers 55 are provided for the respective signal readout lines 53, and amplify charges (electric current outputs), which is read out into the signal readout lines 53. The readout switches 57 are provided for the respective signal readout lines 53 and output the charges (electric current outputs), which is read out of the photodiodes 33, to a signal output line 60. The horizontal shift register 59 outputs a horizontal scan signal to open and close each readout switch 57.

A plurality of bonding pads 61 electrically connected to the amplifier section 51 are formed on the semiconductor substrate 12, as shown in FIGS. 2 and 3. These bonding pads 61 are electrically connected to corresponding bonding pads 65 formed on the mount substrate 23, by bonding wires 63. In this configuration, the outputs from the amplification section 51 are supplied via the mount substrate 23 to the outside of the imaging apparatus 1. A plurality of bonding pads 67 electrically connected to the shift register section 41 are formed on the semiconductor substrate 12 (particularly, cf FIG. 3). These bonding pads 67 are electrically connected to corresponding bonding pads 69 formed on the mount substrate 23, by bonding wires (not shown). In this configuration, signals from the outside of the imaging apparatus 1 are supplied via the mount substrate 23 to the shift register section 41.

The scintillator 21 converts incident radiation (e.g., X-rays) to visible light and is of columnar structure. The scintillator 21, as also shown in FIG. 3, is arranged to cover the region where the photosensitive section 31, the shift register section 41, and the amplification section 51 are formed on one side of the semiconductor substrate 12, and is formed directly on the region. In this configuration, the scintillator 21 is arranged in contact with the region where the photosensitive section 31, the shift register section 41, and the amplification section 51 are formed on one side of the semiconductor substrate 12. The region where the bonding pads 61, 67 are formed on one side of the semiconductor substrate 12 is not covered by the scintillator 21, and is exposed.

A variety of materials can be used for the scintillator 21, and one of preferred materials is Tl (thallium) doped CsI, which demonstrates good luminous efficiency. A protective film (not shown) for hermetically sealing the scintillator 21 while covering the columnar structure of the scintillator 21 so as to fill its gaps is formed on the scintillator 21. The protective film is preferably a material that transmits radiation but shields against water vapor, e.g., poly-para-xylylene (trade name Parylene, available from Three Bond Co., Ltd.), and particularly preferably, poly-para-chloroxylylene (trade name Parylene C, available from the same company). In the present embodiment, the thickness of the scintillator 21 is approximately 300 μm.

The scintillator 21 can be formed by growing columnar crystals of CsI by deposition method. The protective film can be formed by CVD. The methods of forming the scintillator 21 and the protective film are disclosed in detail in PCT International Publication WO98/36290 filed by Applicant of the present application, for example, and the description thereof is omitted herein.

The frame 25 is fixed on the mount substrate 23 so as to surround the solid-state image sensor 11. The frame 25 has an opening 27 of rectangular shape formed at the position corresponding to the photosensitive section 31, and radiation is incident through the opening 27 to the scintillator 21. A space S is created between the frame 25, and the semiconductor substrate 12 and the mount substrate 23. The shift register section 41 and the amplification section 51 of the solid-state image sensor 11, the bonding pads 61, 65, the bonding wires 63, etc. are located inside the space S. Since the bonding wires 63 are placed inside the space S defined by the frame 25, the semiconductor substrate 12, and the mount substrate 23 as described above, the bonding wires 63 are protected from external physical stress, without being pushed by the frame 25. In addition, a shield 29 of a radiation-shielding material (e.g., lead or the like) is provided on the side opposite to the amplification section 51 side, on the frame 25, and the shield 29 well shields against radiation. In the present embodiment, the thickness of the shield 29 is approximately 2.5 mm.

Figure 5:
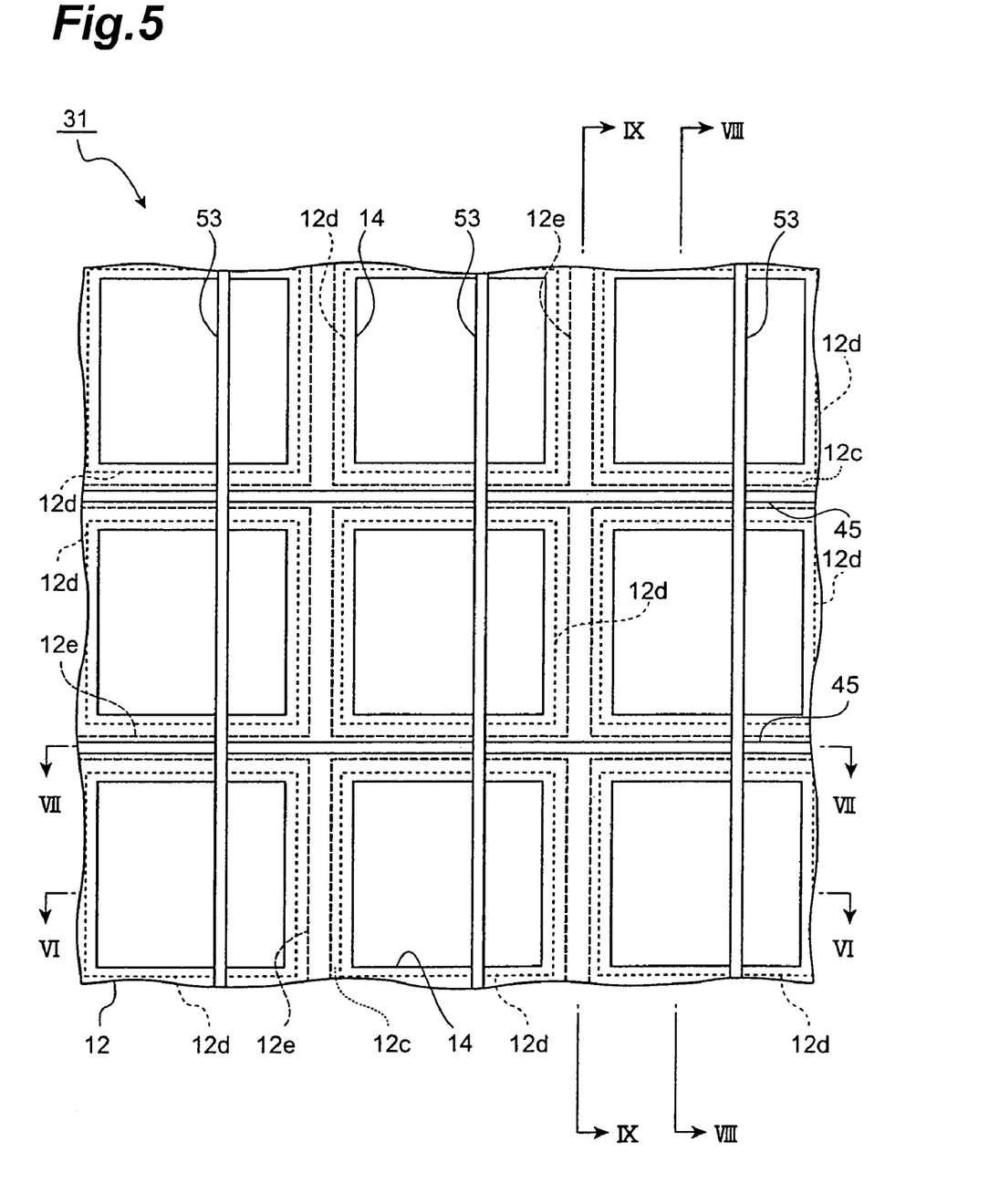
FIG. 5 is a plan view showing a photosensitive section included in a solid-state image sensor of the radiographic imaging apparatus according to the embodiment of the present invention.
Figure 6:
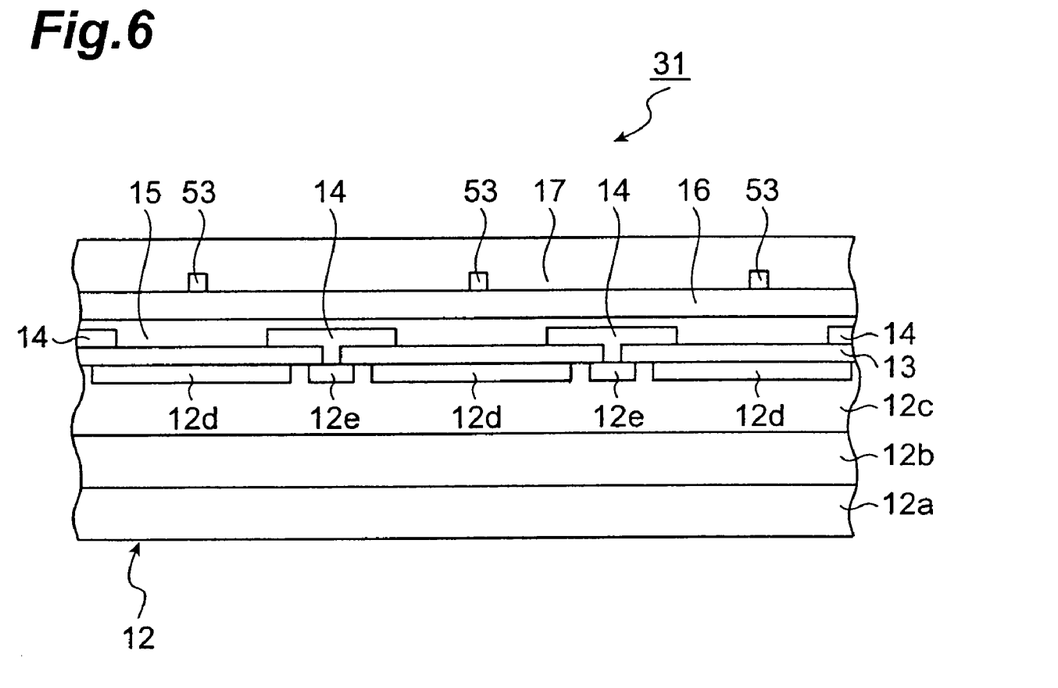
FIG. 6 is a schematic view for explaining a cross-sectional configuration along line VI-VI in FIG. 5.
Figure 7:
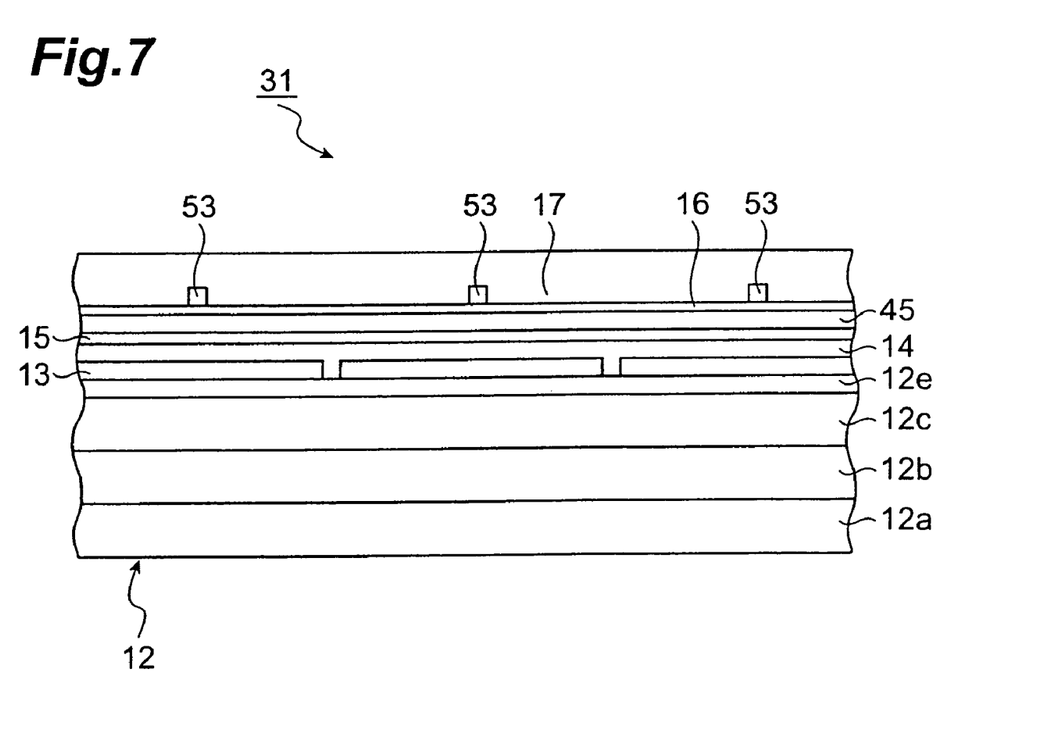
FIG. 7 is a schematic view for explaining a cross-sectional configuration along line VII-VII in FIG. 5.
Figure 8:
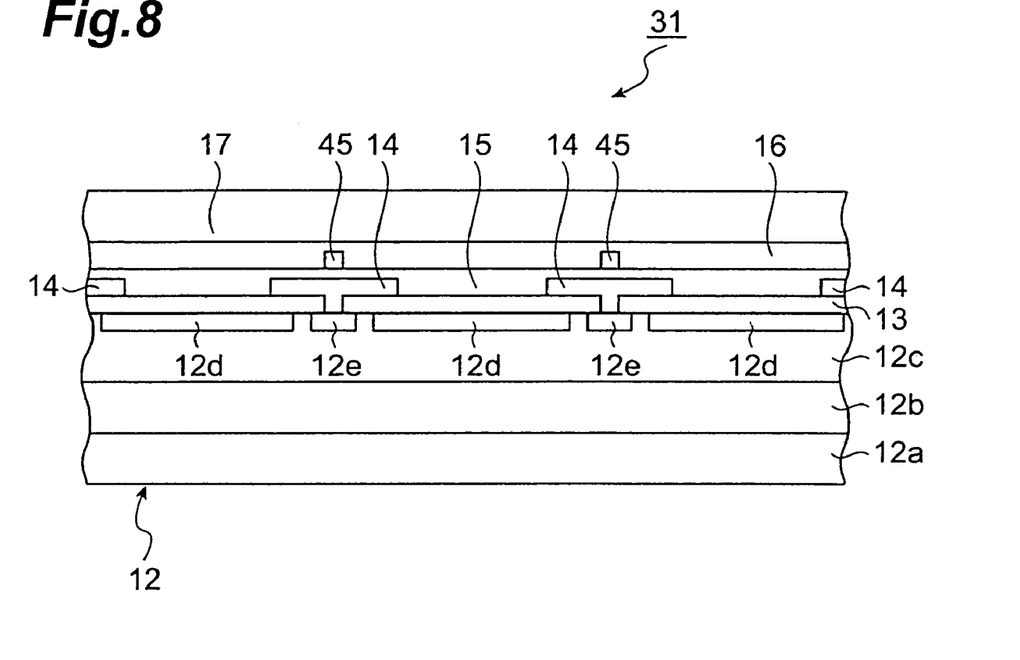
FIG. 8 is a schematic view for explaining a cross-sectional configuration along line VIII-VIII in FIG. 5.
Figure 9:
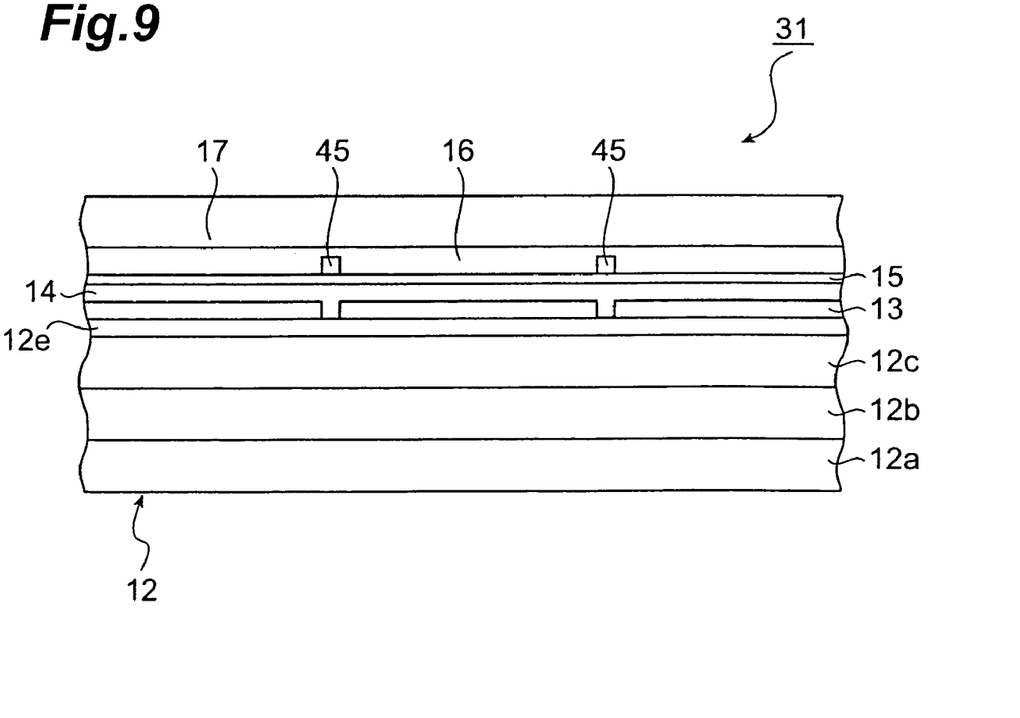
FIG. 9 is a schematic view for explaining a cross-sectional configuration along line IX-IX in FIG. 5.

Next the configuration of the photosensitive section 31 will be described on the basis of FIGS. 5 to 9. FIG. 5 is a plan view showing the photosensitive section. FIG. 6 is a schematic view for explaining a cross-sectional configuration along line VI-VI in FIG. 5. FIG. 7 is a schematic view for explaining a cross-sectional configuration along line VII-VII in FIG. 5. FIG. 8 is a schematic view for explaining a cross-sectional configuration along line VIII-VIII in FIG. 5. FIG. 9 is a schematic view for explaining a cross-sectional configuration along line IX-IX in FIG. 5. FIG. 5 is depicted without illustration of first to fourth insulating layers 13, 15-17, and the gate switches 35.

The semiconductor substrate 12, as shown in FIGS. 6 to 9, includes a $p^+$-type semiconductor substrate 12a, and a $p^-$-type epitaxial semiconductor layer 12b and a $p^-$-type layer 12c are formed on the $p^+$-type semiconductor substrate 12a. The $p^+$-type semiconductor substrate 12a is set at the ground potential. The solid-state image sensor 11 is one using Si as a semiconductor, "high concentration" refers to the impurity concentration of not less than about $1 \times 10^{17}/cm^3$ and is expressed by "+" attached to the conductivity type; "low concentration" refers to the impurity concentration of not more than about $1 \times 10^{15}/cm^3$ and is expressed by "−" attached to the conductivity type.

$N^+$-type semiconductor regions 12d are formed on the front surface side of the $p^-$-type layer 12c, and a pn junction composed of each $n^+$-type semiconductor ($n^+$-type semiconductor region 12d) and the $p^-$-type semiconductor ($p^-$-type layer 12c) constitutes a photodiode (photoelectric converter) 33. The $n^+$-type semiconductor regions 12d each are of rectangular shape when viewed from the direction of incidence of light, and are arrayed in a two-dimensional pattern of M rows and N columns, as shown in FIG. 5. In this configuration, the photodiodes 33 are arrayed in the two-dimensional pattern of M rows and N columns in the photosensitive section 31. In the present embodiment, the length on each side of the $n^+$-type semiconductor regions 12d is set to be approximately 50 μm.

An isolation region 12e of $p^+$-type semiconductor is formed between adjacent $n^+$-type semiconductor regions 12d on the front surface side of the $p^-$-type layer 12c. The isolation region 12e, as shown in FIG. 5, extends along the row direction and along the column direction between adjacent $n^+$-type semiconductor regions 12d and is of grid shape when viewed from the direction of incidence of light.

A first insulating layer (e.g., made of a silicon oxide film) 13 is formed on the $p^-$-type layer 12c, the $n^+$-type semiconductor regions 12d, and the isolation region 12e. A metal (e.g., aluminum) wire (electroconductive member) 14 is electrically connected to the isolation region 12e via through holes formed in the first insulating layer 13. The metal wire 14, as shown in FIG. 5, is provided so as to extend along the row direction and along the column direction between adjacent $n^+$-type semiconductor regions 12d, and is of grid shape when viewed from the direction of incidence of light. The metal wire 14 is grounded and thus the isolation region 12e is set at the ground potential. The metal wire 14 may also be connected to a fixed potential, instead of being grounded.

The width of the metal wire 14 is set greater than the distance between adjacent $n^+$-type semiconductor regions 12d, and part of the metal wire 14 overlaps the edges of $n^+$-type semiconductor regions 12d when viewed from the direction of incidence of light. Namely, the metal wire 14 is provided above the pn junction portions so that its edge covers the pn junction portions (the interfaces between the $p^-$-type layer 12c and the $n^+$-type semiconductor regions 12d) exposed on the light-incident surface (one side) of the semiconductor substrate 12 ($p^-$-type layer 12c).

Figure 10:
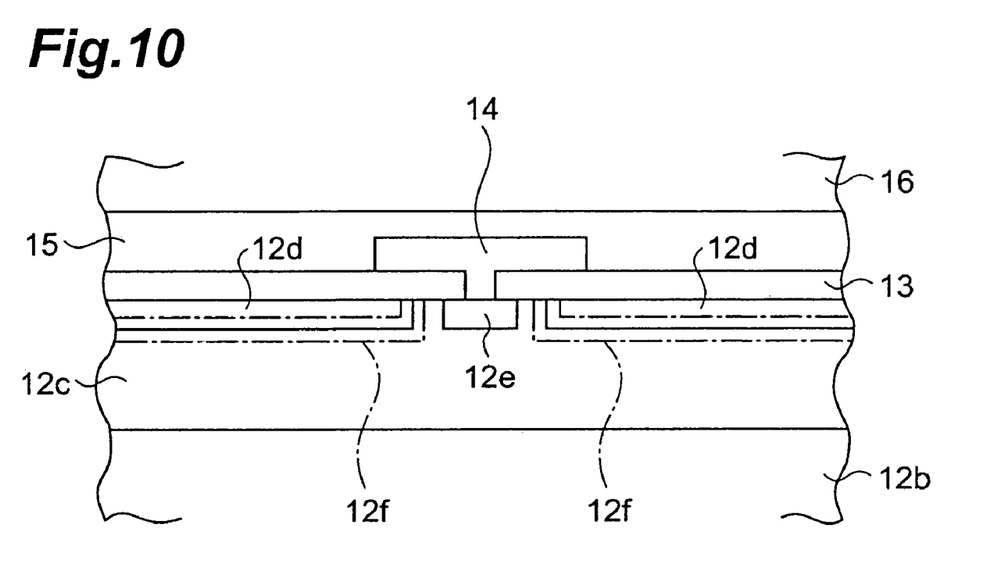
FIG. 10 is a schematic diagram for explaining a cross-sectional configuration of the photosensitive section included in the solid-state image sensor in the radiographic imaging apparatus according to the embodiment of the present invention.

The metal wire 14, as shown in FIG. 10, is preferably provided so as to cover depletion layers 12f formed in the pn junction portions (the interfaces between the $p^-$-type layer 12c and the $n^+$-type semiconductor regions 12d). The size (width) of the depletion layers 12f is dependent upon an impurity concentration in the $p^-$-type layer 12c, an impurity concentration in the $n^+$-type semiconductor region 12d, an applied voltage, and so on. For this reason, the width of the metal wire 14, i.e., the width of the overlapping part with the $n^+$-type semiconductor regions 12d in order to cover the pn junction portions needs to be set, in consideration of these factors. In the present embodiment, the distance between adjacent $n^+$-type semiconductor regions 12d is approximately 4 μm, and the width of the metal wire 14 approximately 5 μm.

A second insulating layer (e.g., made of a silicon oxide film) 15 is formed on the first insulating layer 13. The aforementioned gate lines 45 and a third insulating layer (e.g., made of a silicon oxide film) 16 are formed on the second insulating layer 15. The gate lines 45 are made of metal such as aluminum, located above the metal wire 14 when viewed from the direction of incidence of light, as shown in FIGS. 5, 7, and 8, and provided so as to extend along the row direction and between adjacent $n^+$-type semiconductor regions 12d.

The aforementioned signal readout lines 53 and a fourth insulating layer (e.g., made of a silicon oxide film) 17 are formed on the third insulating layer 16. The signal readout lines 53 are made of metal such as aluminum, and, as shown in FIGS. 5 and 6, the signal readout lines 53 are located above the $n^+$-type semiconductor regions 12d when viewed from the direction of incidence of light, and are provided so as to extend along the column direction. In the present embodiment the width of the signal readout lines 53 is set to be approximately 0.5 μm. The signal readout lines 53 are placed with deviation of approximately 1-20 μm from one side of $n^+$-type semiconductor regions 12d, above the $n^+$-type semiconductor regions 12d.

Since in the present embodiment the metal wire 14 provided so as to cover at least the pn junction portions exposed on one side of the semiconductor substrate 12 is grounded as described above, the charge generated in the region (first insulating layer 13) except for the photodiodes 33 is discharged through the metal wire 14 to the outside, without being accumulated in the pn junction portions. For this reason, it is feasible to suppress the occurrence of the interface leak of charge in the pn junction portions and thereby prevent the deterioration of the SN ratio.

In the present embodiment, the metal wire 14 is of grid shape when viewed from the direction of incidence of light to the photosensitive section 31, and is provided so as to cover the pn junction portions exposed on one side of the semiconductor substrate 12 and the portions between adjacent $n^+$-type semiconductor regions 12d. This permits the electroconductive member to be simply and readily implemented in the configuration capable of discharging the charge generated in the region except for the photodiodes 33, to the outside and securely suppressing the occurrence of the interface leak of charge in the pn junction portions.

In the present embodiment, the photosensitive section 31 includes the isolation region 12e formed between adjacent n+-type semiconductor regions 12d, and the metal wire 14 is electrically connected to the isolation region 12e. This can achieve commonality between the electroconductive member for discharging the charge generated in the region except for the photodiodes 33, to the outside, and the electroconductive member for grounding the isolation region 12e, thereby preventing complexity of structure.

In the present embodiment, the gate lines 45 are located above the metal wire 14. In this configuration, the metal wire 14 shields against the noise generated with change of the supply voltage (switching between the H level and the L level) in the gate lines 45 on the occasion of supplying the vertical scan signal to the control terminal of each gate switch 35. This can prevent the noise from being superimposed on the outputs from the photodiodes 33.

Figure 11:
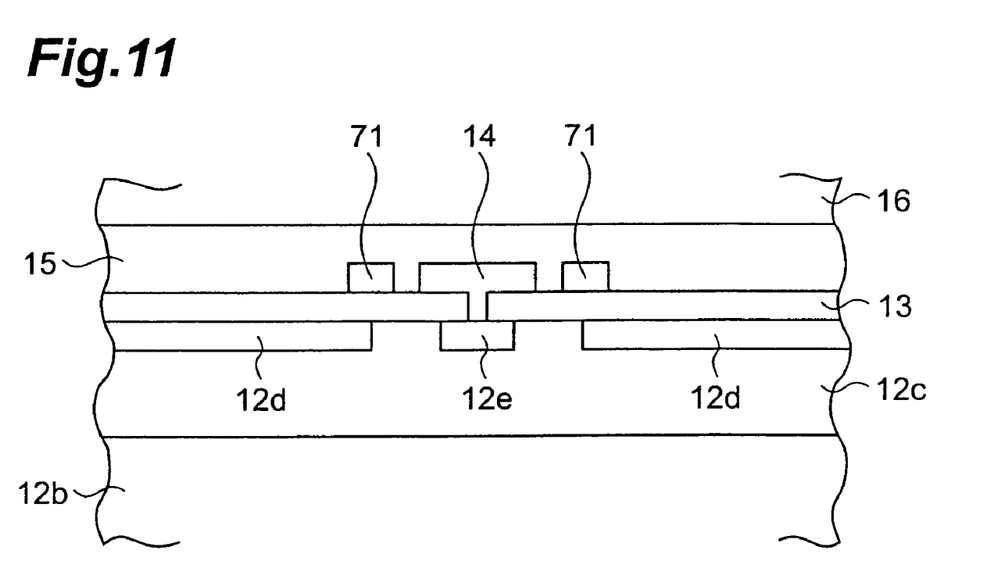
FIG. 11 is a schematic diagram for explaining a cross-sectional configuration in a modification example of the radiographic imaging apparatus according to the embodiment of the present invention.
Figure 12:
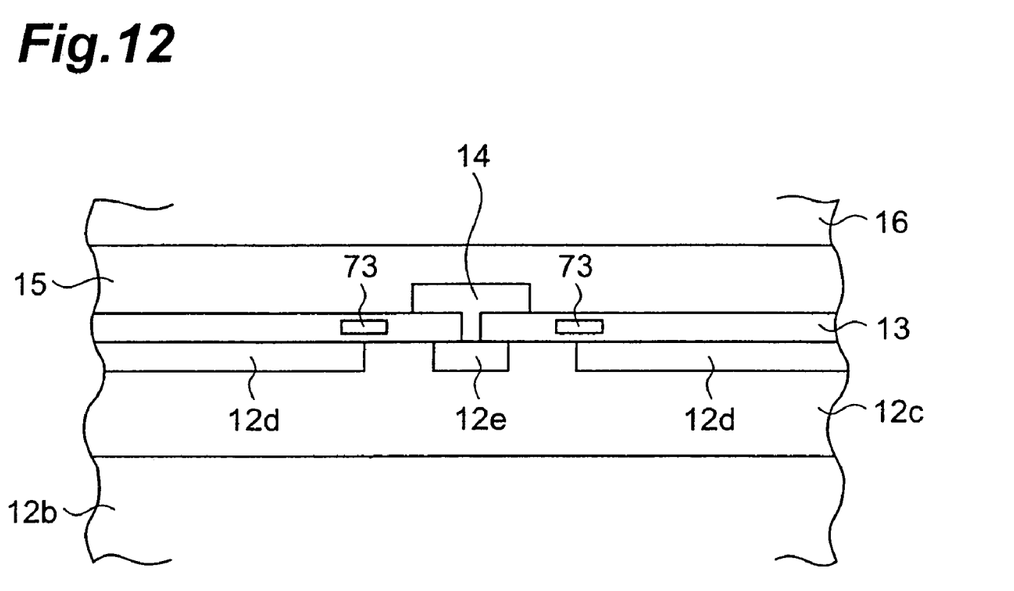
FIG. 12 is a schematic diagram for explaining a cross-sectional configuration in another modification example of the radiographic imaging apparatus according to the embodiment of the present invention.

The present invention is by no means limited to the above-described embodiment. The present embodiment is configured to discharge the charge generated in the region except for the photodiodes 33 to the outside by the metal wire 14 for grounding the isolation region 12e, but the invention is not limited to this configuration. For example, as shown in FIG. 11, it is also possible to adopt a configuration wherein an electroconductive member 71 (e.g., an aluminum wire), separate from the metal wire 14 for grounding the isolation region 12e, is provided so as to cover at least the pn junction portions exposed on one side of the semiconductor substrate 12 and wherein the charge generated in the region except for the photodiodes 33 is discharged to the outside by the electroconductive member 71. It is also possible to adopt another configuration, as shown in FIG. 12, wherein an electroconductive member 73 of polysilicon is provided so as to cover at least the pn junction portions exposed on one side of the semiconductor substrate 12, in the first insulating layer 13 and wherein the charge generated in the region except for the photodiodes 33 is discharged to the outside by the electroconductive member 73.

The scintillator 21 is formed directly on the semiconductor substrate 12 in the present embodiment, but the structure is not limited to this. For example, it is also possible to adopt a configuration wherein a scintillator substrate is formed by laying a scintillator on a radiation-transmitting substrate and wherein the scintillator substrate is arranged so as to keep the scintillator in contact with the region where the photosensitive section 31, the shift register section 41, and the amplification section 51 are formed on one side of the semiconductor substrate 12. In a case where a protective film is formed on the scintillator, the protective film is brought into contact with the region where the photosensitive section 31, the shift register section 41, and the amplification section 51 are formed.

INDUSTRIAL APPLICABILITY

The solid-state imaging apparatus and the radiographic imaging apparatus of the present invention are applicable to radiographic imaging systems of large area, particularly, used in medical and industrial X-ray photography.

The invention claimed is:

1. A solid-state imaging apparatus comprising:
    a photosensitive section comprising a semiconductor substrate of a first conductivity type, and a plurality of second conductivity type semiconductor regions arrayed in a two-dimensional pattern on one side of the semiconductor substrate, wherein the semiconductor substrate and each second conductivity type semiconductor region constitute a pn junction to function as a photodiode;
    signal lines for readout of outputs from the photodiodes, which are electrically connected to the photodiodes;
    a switch group consisting of a plurality of switches for controlling electrical connection and disconnection between each photodiode and the signal line in each column of the photodiodes;
    wires connected to control terminals of the respective switches forming the switch group, and arranged to supply a scan signal to turn each switch off or on in each row of the photodiodes, to the control terminals; and
    an electroconductive member provided so as to cover at least the pn junction portions exposed on the one side of the semiconductor substrate,
    wherein the electroconductive member is connected to a fixed potential, or is grounded, and
    wherein the wires are located above the electroconductive member so as to overlap the electroconductive member when viewed from a direction of incidence of light.

2. The solid-state imaging apparatus according to claim 1, wherein the electroconductive member is of grid shape when viewed from a direction of incidence of light to the photosensitive section, and is provided so as to cover the pn junction portions exposed on the one side of the semiconductor substrate and portions between the second conductivity type semiconductor regions adjacent to each other.

3. The solid-state imaging apparatus according to claim 1, wherein the photosensitive section further comprises an isolation region formed between the second conductivity type semiconductor regions adjacent to each other, and
    wherein the electroconductive member is electrically connected to the isolation region.

4. A radiographic imaging apparatus comprising: the solid-state imaging apparatus as set forth in claim 1; and
    a scintillator for converting radiation to visible light, which is provided so as to cover the plurality of photodiodes and be in contact with a light incident surface of the solid-state imaging apparatus.

5. The solid-state imaging apparatus according to claim 1, wherein the signal lines are located above the wires so as to place an insulating layer therebetween.

6. The solid-state imaging apparatus according to claim 1, wherein the signal lines are located above the second conductivity type semiconductor regions so as to be apart from portions between the second conductivity type semiconductor regions adjacent to each other and intersect with the second conductivity type semiconductor regions when viewed from the direction of incidence of light.

7. A solid-state imaging apparatus comprising:
    a photosensitive section comprising a semiconductor substrate of a first conductivity type, and a plurality of second conductivity type semiconductor regions arrayed in a matrix of M rows and N columns on one side of the semiconductor substrate, wherein the semiconductor substrate and each second conductivity type semiconductor region constitute a pn junction to function as a photodiode;
    first wires provided in the respective columns;
    a first switch group consisting of a plurality of switches for connection between each photodiode and the first wire in each column;

a vertical shift register for outputting a vertical scan signal to open and close each switch forming the first switch group, in each row;

second wires for connecting control terminals of the respective switches forming the first switch group, to the vertical shift register in each row;

a second switch group consisting of a plurality of switches for connection between each first wire and a signal output line;

a horizontal shift register for outputting a horizontal scan signal to open and close each switch forming the second switch group, in each column; and an electroconductive member provided so as to cover at least the pn junction portions exposed on the one side of the semiconductor substrate, wherein the electroconductive member is connected to a fixed potential, or is grounded, and wherein the second wires are located above the electroconductive member so as to overlap the electroconductive member when viewed from a direction of incidence of light.

8. The solid-state imaging apparatus according to claim 7, wherein the electroconductive member is of grid shape when viewed from a direction of incidence of light to the photosensitive section, and is provided so as to cover the pn junction portions exposed on the one side of the semiconductor substrate and portions between the second conductivity type semiconductor regions adjacent to each other.

9. The solid-state imaging apparatus according to claim 7, wherein the photosensitive section further comprises an isolation region formed between the second conductivity type semiconductor regions adjacent to each other, and wherein the electroconductive member is electrically connected to the isolation region.

10. The solid-state imaging apparatus according to claim 7, wherein the first wires are located above the second wires so as to place an insulating layer therebetween.

11. The solid-state imaging apparatus according to claim 7, wherein the first wires are located above the second conductivity type semiconductor regions so as to be apart from portions between the second conductivity type semiconductor regions adjacent to each other and intersect with the second conductivity type semiconductor regions when viewed from the direction of incidence of light.

12. A radiographic imaging apparatus comprising:

the solid-state imaging apparatus as set forth in claim 7, and a scintillator for converting radiation to visible light, which is provided so as to cover the plurality of photodiodes and be in contact with a light incident surface of the solid-state imaging apparatus.

* * * * *